US012755775B2

(12) United States Patent
Gu

(10) Patent No.: US 12,755,775 B2
(45) Date of Patent: Oct. 6, 2026

(54) MEMORY COMPRISING COMMAND DECODING CIRCUIT AND CONTROL CIRCUIT

(71) Applicant: CXMT CORPORATION, Hefei (CN)

(72) Inventor: Yinchuan Gu, Hefei (CN)

(73) Assignee: CXMT Corporation, Hefei (CN)

( * ) Notice: Subject to any disclaimer, the term of this patent is extended or adjusted under 35 U.S.C. 154(b) by 96 days.

(21) Appl. No.: 18/890,760

(22) Filed: Sep. 20, 2024

(65) Prior Publication Data

US 2025/0014633 A1 Jan. 9, 2025

Related U.S. Application Data

(63) Continuation of application No. PCT/CN2023/076975, filed on Feb. 17, 2023.

(30) Foreign Application Priority Data

Jan. 3, 2023 (CN) ......................... 202310003129.7

(51) Int. Cl.
*G11C 11/408* (2006.01)
*H03K 19/20* (2006.01)

(52) U.S. Cl.
CPC .......... *G11C 11/4087* (2013.01); *H03K 19/20* (2013.01)

(58) Field of Classification Search
CPC ...... G11C 11/4087; G11C 11/407; G11C 8/10
See application file for complete search history.

(56) References Cited

U.S. PATENT DOCUMENTS

2013/0265842 A1* 10/2013 Ware ........................ G11C 8/06 365/230.03
2017/0270987 A1* 9/2017 Matsuoka .......... G11C 13/0002

FOREIGN PATENT DOCUMENTS

CN 106373609 B 1/2021

* cited by examiner

*Primary Examiner* — Han Yang
(74) *Attorney, Agent, or Firm* — Intellectual Valley Law, P.C.

(57) ABSTRACT

A memory is provided in this application, including multiple group regions, a command decoding circuit, and a control circuit. Each group region includes multiple bank groups, and each bank group corresponds to one bank group address. An active instruction is received by the command decoding circuit, and the active instruction is decoded to obtain an active command signal. The bank group address, a row address, and the active command signal are received by the control circuit, and the row address is sent to one of the group regions based on the active command signal and the bank group address.

12 Claims, 10 Drawing Sheets

MEMORY COMPRISING COMMAND DECODING CIRCUIT AND CONTROL CIRCUIT

CROSS-REFERENCES TO RELATED APPLICATIONS

This application is a continuation of PCT/CN2023/076975, filed on Feb. 17, 2023, which claims priority to Chinese Patent Application No. 202310003129.7, filed with the China National Intellectual Property Administration on Jan. 3, 2023 and entitled "MEMORY", which are incorporated herein by reference in their entireties.

TECHNICAL FIELD

This application relates to but is not limited to a memory.

BACKGROUND

As memory technologies develop, memories are widely used in various fields, for example, the dynamic random access memory (DRAM) is widely used.

An address circuit and a bank are disposed in the memory, and an address received by the memory is processed by the address circuit and then transmitted to the bank. Therefore, improvements to the address circuit are beneficial to optimizing memory performance.

SUMMARY

A memory is provided in this application, including multiple group regions, a command decoding circuit, and a control circuit.

Each group region includes multiple bank groups, and each bank group corresponds to one bank group address.

An active instruction is received by the command decoding circuit, and the active instruction is decoded to obtain an active command signal.

The bank group address, a row address, and the active command signal are received by the control circuit, and the row address is sent to one of the group regions based on the active command signal and the bank group address.

In some embodiments, the control circuit is configured to: send the row address to the one of the group regions based on the active command signal and at least one target bit of the bank group address.

The target bit of the bank group address is the same address bit as a corresponding address bit in any other bank group address in the group region.

In some embodiments, the bank group address has one target bit, and the memory includes a first group region and a second group region.

The control circuit includes a first address processing circuit and two row address transmission circuits, denoted as a first row address transmission circuit and a second row address transmission circuit.

The first address processing circuit is configured to obtain a complementary target bit based on the target bit.

The complementary target bit is received at an input terminal of the first row address transmission circuit, and the row address is sent to the first group region based on the complementary target bit and the active command signal.

The target bit is received at an input terminal of the second row address transmission circuit, and the row address is sent to the second group region based on the target bit and the active command signal.

In some embodiments, the first address processing circuit includes:

- a first flip-flop, where the target bit is received at an input terminal, the active command signal is received at a clock terminal, the target bit is output through an output terminal, and the complementary target bit is output through a complementary output terminal.

In some embodiments, the first address processing circuit includes:

- a first inverter, where the target bit is received at an input terminal, and the complementary target bit of the target bit is output through an output terminal.

In some embodiments, the first row address transmission circuit includes:

- a first AND gate, including two input terminals, where the complementary target bit is received at a first input terminal, the active command signal is received at a second input terminal, and an output terminal is connected to a clock terminal of a second flip-flop; and
- the second flip-flop, configured to output the row address to the first group region under triggering of a signal received at the clock terminal, where the row address is received at an input terminal.

The second row address transmission circuit includes:

- a second AND gate, including two input terminals, where the target bit is received at a first input terminal, the active command signal is received at a second input terminal, and an output terminal is connected to a clock terminal of a third flip-flop; and
- the third flip-flop, configured to output the row address to the second group region under triggering of a signal received at the clock terminal, where the row address is received at an input terminal.

In some embodiments, the bank group address has n target bits, the n target bits are denoted as a first target bit, a second target bit, . . . , and an nth target bit, the memory includes $2^n$ group regions, and n is an integer greater than 1.

The control circuit includes a second address processing circuit, $2^n$ control signal circuits, and $2^n$ row address transmission circuits. The $2^n$ control signal circuits are in a one-to-one correspondence with the $2^n$ row address transmission circuits, and the $2^n$ row address transmission circuits are in a one-to-one correspondence with the $2^n$ group regions.

The second address processing circuit is configured to obtain complementary target bits of the n target bits.

Each control signal circuit is configured to generate one control signal based on n input signals. The n input signals are denoted as a first input signal, a second input signal, . . . , and an nth input signal. If an ith target bit of a bank group address in a group region corresponding to the control signal circuit is at a first level, an ith input signal is the ith target bit; and if the ith target bit of the bank group address in the group region corresponding to the control signal circuit is at a second level, the ith input signal is a complementary target bit of the ith target bit. $1 \le i \le n$, and i is an integer.

A corresponding control signal is received by each row address transmission circuit, which is configured to send the row address to a corresponding group region based on the control signal and the active command signal.

In some embodiments, the second address processing circuit includes n fourth flip-flops, denoted as a first fourth flip-flop, a second fourth flip-flop, . . . , and an nth fourth flip-flop.

An ith target bit is received at an input terminal of an ith fourth flip-flop, the active command signal is received at a clock terminal of the ith fourth flip-flop, the ith target bit is output through an output terminal of the ith fourth flip-flop, and a complementary target bit of the ith target bit is output through a complementary output terminal of the ith fourth flip-flop.

In some embodiments, the second address processing circuit includes n second inverters, denoted as a first second inverter, a second inverter, . . . , and an nth second inverter.

An ith target bit is received at an input terminal an ith second inverter, and a complementary target bit of the ith target bit is output through an output terminal of the ith second inverter.

In some embodiments, when the first level is a low level and the second level is a high level, the control signal circuit includes:

a NOR gate, including n input terminals with each input terminal receiving one input signal, and the control signal is output after a NOR operation is performed on the n input signals.

In some embodiments, when the first level is a high level and the second level is a low level, the control signal circuit includes:

a third AND gate, including n input terminals with each input terminal receiving one input signal, and the control signal is output after an AND operation is performed on the n input signals.

In some embodiments, the row address transmission circuit includes:

a fourth AND gate, including two input terminals, where the control signal is received at a first input terminal, the active command signal is received at a second input terminal, and an output terminal is connected to a clock terminal of a fifth flip-flop; and the fifth flip-flop, configured to output the row address under triggering of a signal received at the clock terminal, where the row address is received at an input terminal.

In some embodiments, the memory includes:

a window signal circuit, connected to the command decoding circuit and configured to receive the active command signal, the bank group address, and a bank address, and activate, based on the active command signal, the bank group address, and the bank address, a bank corresponding to the bank group address and the bank address.

The memory provided in this application includes multiple group regions, a command decoding circuit, and a control circuit. Each group region includes multiple bank groups, and each bank group corresponds to one bank group address. An active instruction is received by the command decoding circuit, and the active instruction is decoded to obtain an active command signal. The bank group address, a row address, and the active command signal are received by the control circuit, and the row address is sent to one of the group regions based on the active command signal and the bank group address. The row address is sent to only one of the multiple group regions, and therefore row address sending paths are reduced, thereby reducing power consumption of the memory.

BRIEF DESCRIPTION OF DRAWINGS

The accompanying drawings herein, which are incorporated in and constitute a part of the specification, illustrate embodiments conforming to this application, and are used together with the specification to explain the principles of this application.

100. command decoding circuit; 200. control circuit; 210. first address processing circuit; 220. first row address transmission circuit; 230. second row address transmission circuit; 221. first AND gate; 222. second flip-flop; 231. second AND gate; 232. third flip-flop; 300. window signal circuit; 410. second address processing circuit; 420. control signal circuit; 430. row address transmission circuit; 411. fourth flip-flop; 431. fourth AND gate; and 432. fifth flip-flop.

The foregoing accompanying drawings already show clear embodiments of this application, which are described in more detail below. These accompanying drawings and text descriptions are not intended to limit the scope of the concept of this application in any manner, but to describe the concept of this application for a person skilled in the art with reference to specific embodiments.

DESCRIPTION OF EMBODIMENTS

Example embodiments are described herein in detail, and examples thereof are shown in the accompanying drawings. When the following descriptions relate to the accompanying drawings, unless otherwise indicated, the same numbers in different accompanying drawings represent the same or similar elements. Implementations described in the following example embodiments do not represent all implementations consistent with this application. On the contrary, they are merely examples of apparatuses and methods that are consistent with some aspects of this application as detailed in the appended claims.

Figure 1:
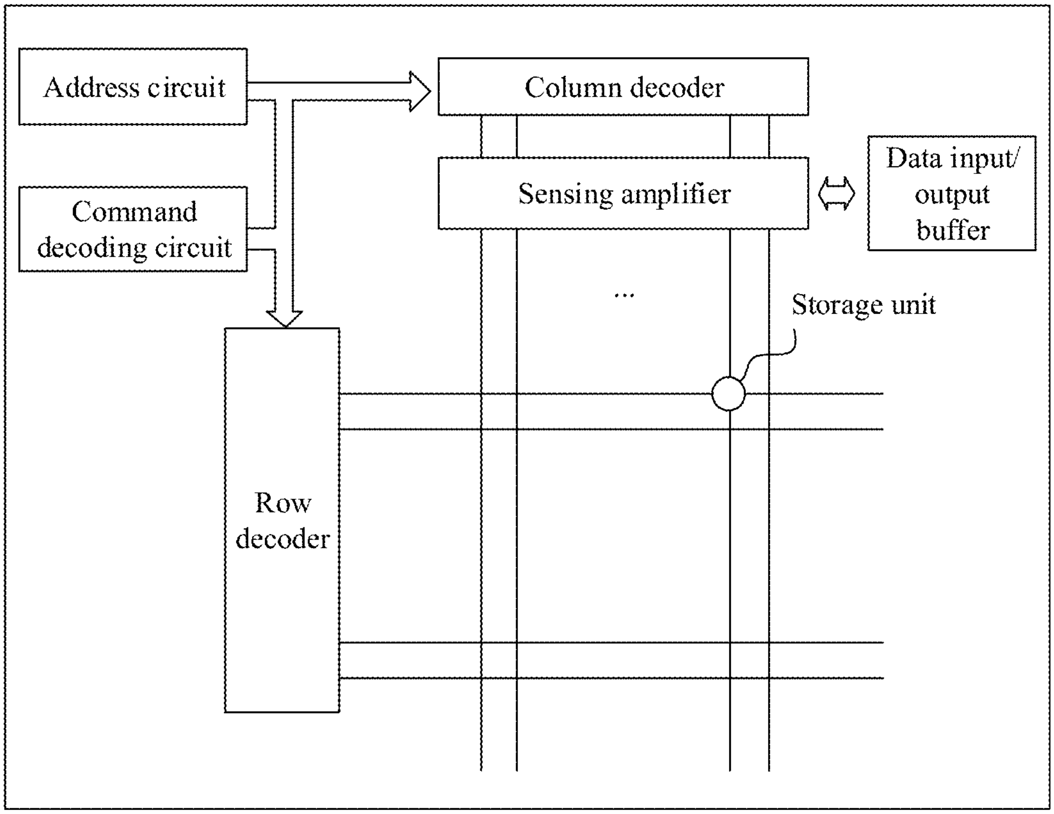
FIG. 1 is an example diagram of an architecture of a memory according to an embodiment.

FIG. 1 is an example diagram of an architecture of a memory according to an embodiment. As shown in FIG. 1, a DRAM is used as an example, including a command decoding circuit, an address circuit, a data input/output buffer, a row decoder, a column decoder, a sensing amplifier, and a bank. The command decoding circuit, the address circuit, and the data input/output buffer are peripheral region circuits, and the sensing amplifier, the row decoder, the column decoder, and the bank are array region circuits. The bank mainly includes a word line, a bit line, and a storage unit. The word line in the bank extends in the row direction, the bit line in the bank extends in the column direction, and the storage unit of the bank is at the position at which the word line intersects with the bit line.

In actual application, the array region circuit of the memory includes multiple groups of banks, and each group of banks is referred to as a bank group. Each bank group is provided with one address, which is referred to as a bank group address. Each bank is provided with one address, which is referred to as a bank address. Three types of addresses are received by the address circuit. The first type is a row address or a column address, the second type is a bank address, and the third type is a bank group address.

An input command is decoded by the command decoding circuit to output a corresponding operation signal, and then a corresponding operation is performed on data in the bank in the array region circuit with reference to an address received by a memory pin. When the operation signal is an active instruction, the row address, the bank group address, and the bank address are received by the pin of the memory. A corresponding bank is activated by the memory based on the bank group address and the bank address, that is, a bank to which the bank group address and the bank address point is activated. In addition, the row address is transmitted to each bank by the memory, and then a corresponding word line is activated by a row decoder in the activated bank after the row address is received, to perform an operation on a storage unit in the corresponding bank. When the row address is transmitted to each bank by the address circuit in a peripheral region, there are a relatively large quantity of transmission paths, causing current consumption and an increase in power consumption of the memory.

It should be noted that the figure is merely an example, and a specific region architecture may be adjusted based on an actual requirement, but is not limited to the example in the figure. Some aspects of the embodiments of the present disclosure relate to the foregoing considerations. Example descriptions of the solutions are provided below with reference to some embodiments of the present disclosure.

Figure 2:
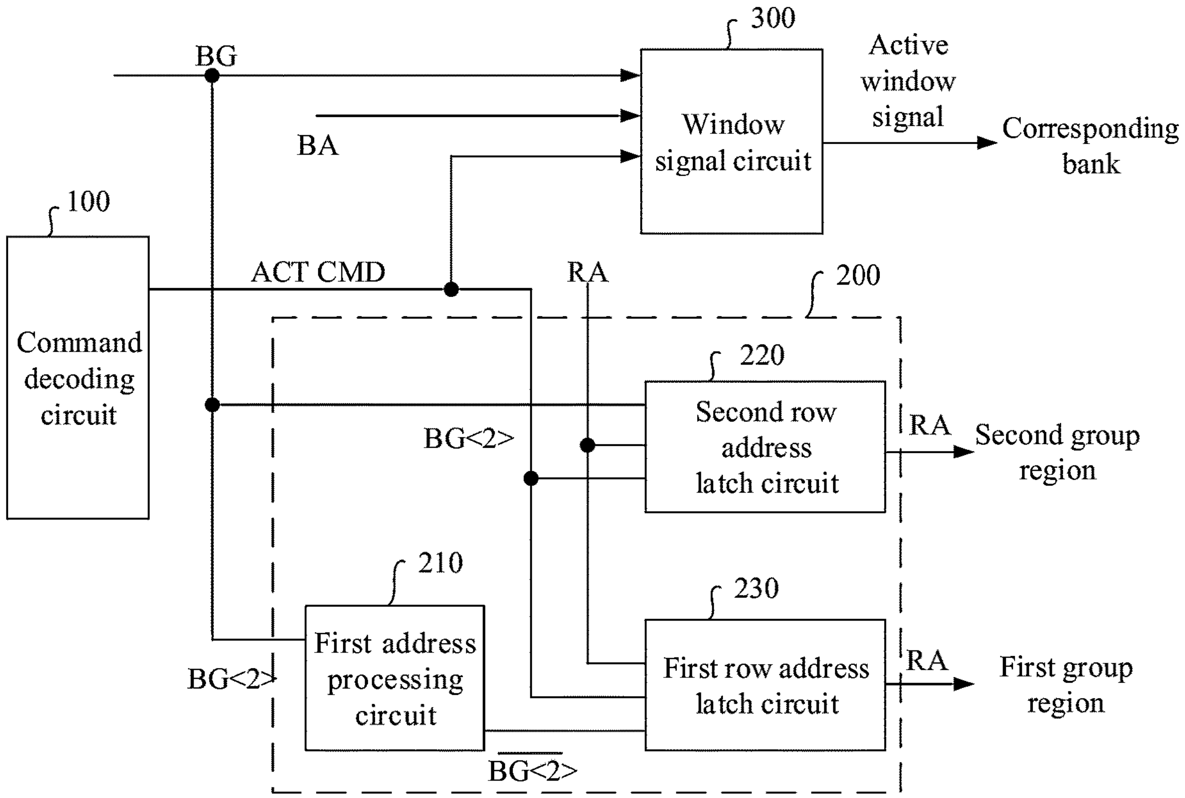
FIG. 2 is a schematic diagram of a circuit of a memory according to an embodiment of this application.

FIG. 2 is a schematic diagram of a circuit of a memory according to an embodiment of this application. As shown in FIG. 2, a memory is provided in an embodiment of this application, including multiple group regions, a command decoding circuit 100, and a control circuit 200.

Each group region includes multiple bank groups, and each bank group corresponds to one bank group address. An active instruction is received by the command decoding circuit 100, and the active instruction is decoded to obtain an active command (ACT CMD) signal. The bank group address (BG), a row address (RA), and the active command (ACT CMD) signal are received by the control circuit 200, and the row address is sent to one of the group regions based on the active command signal and the bank group address. The row address is sent to only one of the multiple group regions, and therefore row address sending paths are reduced, thereby reducing power consumption of the memory.

Further, the row address is sent to the one of the group regions by the control circuit 200 based on the active command signal and at least one target bit of the bank group address. The target bit of the bank group address is the same address bit as a corresponding address bit in any other bank group address in the group region. In other words, if an address bit has the same level in all bank group addresses in the group region, the address bit is a target bit, and the target bit may be configured to represent the group region. The row address is sent to a bank group whose target bit level is the same as a target bit level at the bank group address received by the control circuit 200, to send the row address to a group region in which a bank group corresponding to the bank group address received by the control circuit 200 is located, so that row address sending paths are reduced, thereby reducing power consumption of the memory.

As shown in FIG. 2, the memory includes a window signal circuit 300. The window signal circuit 300 is connected to the command decoding circuit 100. The window signal circuit 300 is configured to receive the active command ACT CMD signal, the bank group address BG, and a bank address BA, and activate, based on the active command signal, the bank group address, and the bank address, a bank corresponding to the bank group address and the bank address.

Figure 3A:
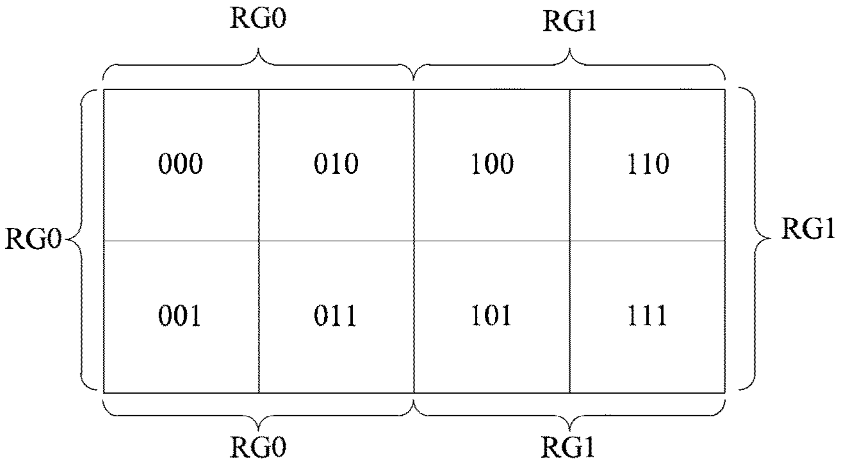
FIG. 3A, FIG. 3B, and FIG. 3C are respectively schematic diagrams of layouts of a group region according to an embodiment of this application.
Figure 3B:
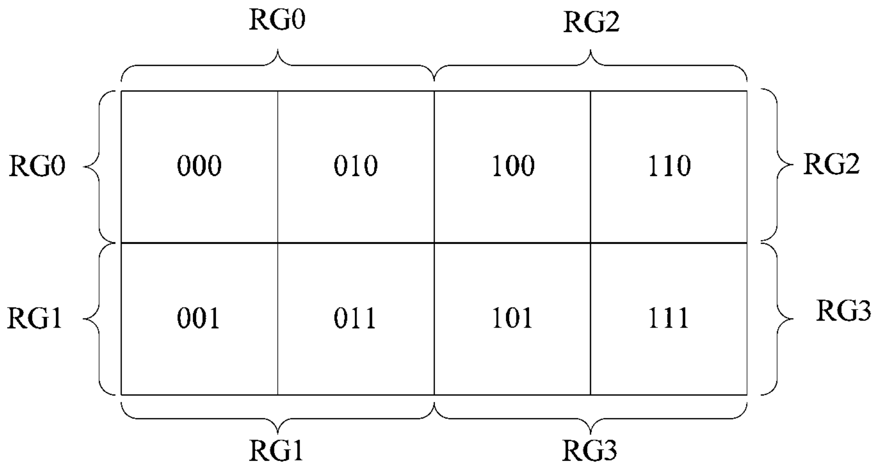
Figure 3C:
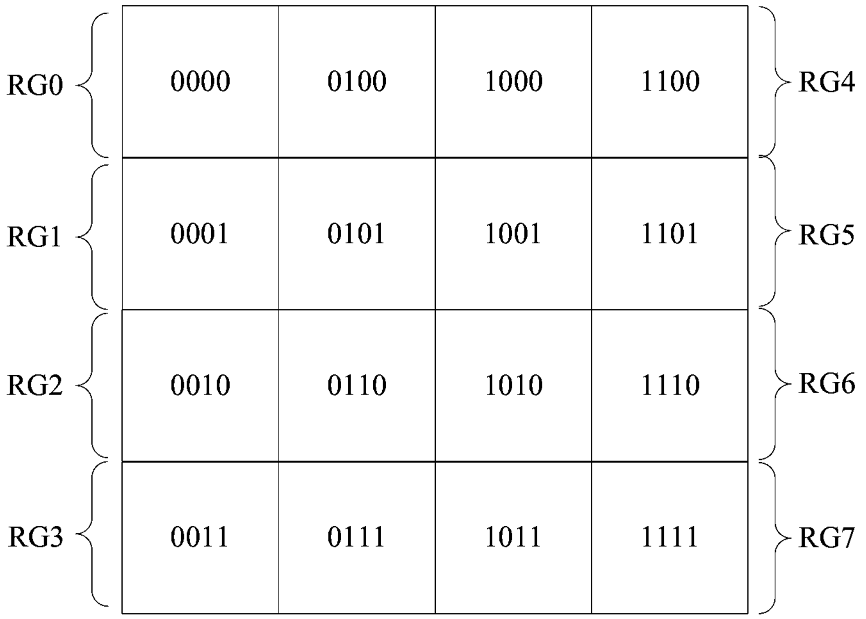

FIG. 3A, FIG. 3B, and FIG. 3C are schematic diagrams of layouts of a group region according to an embodiment of this application. As shown in FIG. 3A, FIG. 3B, and FIG. 3C, there are multiple group regions in a memory, each group region includes multiple bank groups, and each bank group corresponds to one bank group address. FIG. 3A shows an example in which the memory includes two group regions. A bank group address has 3 bits, and is denoted as BG<2:0>. The two group regions are respectively a first group region RG0 and a second group region RG1. The first group region RG0 includes four bank groups, and bank group addresses of the four bank groups are BG<2:0>=000, BG<2:0>=001, BG<2:0>=010, and BG<2:0>=011. The second group region RG1 includes four bank groups, and bank group addresses of the four bank groups are BG<2:0>=100, BG<2:0>=101, BG<2:0>=110, and BG<2:0>=111.

Address bits BG<2> in the bank group addresses in the first group region RG0 are fixed and are all at a low level. Therefore, BG<2> is a target bit of the bank group address in the first group region RG0, and a target bit level is a low level. Address bits BG<2> in the bank group addresses in the second group region RG1 are fixed and are all at a high level. Therefore, BG<2> is a target bit of the bank group address in the second group region RG1, and a target bit level is a high level.

For example, the bank group address BG<2:0>=001 is received by the control circuit 200. For BG<2:0>=001, the target bit is BG<2>=0. The row address is sent to all bank group addresses including the target bit BG<2>=0, that is, the row address is sent to BG<2:0>=000, BG<2:0>=001, BG<2:0>=010, and BG<2:0>=011. In this way, the row address is sent to the first group region RG0, and the row address is not sent to the second group region RG1.

FIG. 3B shows an example in which the memory includes four group regions. A bank group address has 3 bits, and is denoted as BG<2:0>. The four group regions each include two bank groups. The four group regions are respectively a first group region RG0, a second group region RG1, a third group region RG2, and a fourth group region RG3. Two bank group addresses of the first group region RG0 are BG<2:0>=000 and BG<2:0>=010, two bank group addresses of the second group region RG1 are BG<2:0>=001 and BG<2:0>=011, two bank group addresses of the third group region RG2 are BG<2:0>=100 and BG<2:0>=110, and two bank group addresses of the fourth group region RG3 are BG<2:0>=101 and BG<2:0>=111.

Address bits BG<2> and BG<0> in the bank group addresses in each group region are fixed, and therefore BG<2> and BG<0> are target bits of the bank group addresses. The target bit BG<2> of the bank group address in the first group region RG0 is at a low level, and BG<0> is also at a low level. The target bit BG<2> of the bank group address in the second group region RG1 is at a low level, and BG<0> is at a high level. The target bit BG<2> of the bank group address in the third group region RG2 is at a high level, and BG<0> is at a low level. The target bit BG<2> of the bank group address in the fourth group region RG3 is at a high level, and BG<0> is at a high level.

For example, the bank group address BG<2:0>=001 is received by the control circuit 200. For BG<2:0>=001, the target bit BG<2>=0 and the target bit BG<0>=1. The row address is sent to bank groups corresponding to all bank group addresses including the target bit BG<2>=0 and the target bit BG<0>=1, that is, the row address is sent to BG<2:0>=001 and BG<2:0>=011. In this way, the row address is sent to the second group region RG1, and the row address is not sent to the first group region RG0, the third group region RG2, and the fourth group region RG3.

FIG. 3C shows an example in which the memory includes eight group regions. A bank group address has 4 bits, and is denoted as BG<3:0>. The eight group regions each include two bank groups. Two bank group addresses of a first group region RG0 are BG<3:0>=0000 and BG<3:0>=0100, two bank group addresses of a second group region RG1 are BG<3:0>=0001 and BG<3:0>=0101, two bank group addresses of a third group region RG2 are BG<3:0>=0010 and BG<3:0>=0110, two bank group addresses of a fourth group region RG3 are BG<3:0>=0101 and BG<3:0>=0111, two bank group addresses of a fifth group region RG4 are BG<3:0>=1000 and BG<3:0>=1100, two bank group addresses of a sixth group region RG5 are BG<3:0>=1001 and BG<3:0>=1101, and two bank group addresses of a seventh group region RG6 are BG<3:0>=1011 and BG<3:0>=1111.

Address bits BG<3>, BG<1>, and BG<0> in the bank group addresses in each group region are fixed, and therefore BG<3>, BG<1>, and BG<0> are target bits of the bank group addresses. The target bit BG<3> of the bank group address in the first group region RG0 is at a low level, BG<1> is at a low level, and BG<0> is also at a low level. The target bit BG<3> of the bank group address in the second group region RG1 is at a low level, BG<1> is at a low level, and BG<0> is at a high level. The target bit BG<3> of the bank group address in the third group region RG2 is at a low level, BG<1> is at a high level, and BG<0> is at a low level. BG<3> of the bank group address in the fourth group region RG3 is at a low level, BG<1> is at a high level, and BG<0> is at a high level. The target bit BG<3> of the bank group address in the fifth group region RG4 is at a high level, BG<1> is at a low level, and BG<0> is also at a low level. The target bit BG<3> of the bank group address in the sixth group region RG5 is at a high level, BG<1> is at a low level, and BG<0> is at a high level. The target bit BG<3> of the bank group address in the seventh group region RG6 is at a high level, BG<1> is at a high level, and BG<0> is at a low level. BG<3> of the bank group address in the eighth group region RG7 is at a high level, BG<1> is at a high level, and BG<0> is at high level.

For example, the bank group address BG<3:0>=0001 is received by the control circuit 200. For BG<3:0>=0001, the target bits BG<3>=0, BG<1>=0, and BG<0>=1. The row address is sent to bank groups corresponding to all bank group addresses including the target bits BG<3>=0, BG<1>=0, and BG<0>=1, that is, the row address is sent to a bank group corresponding to BG<3:0>=0001 and BG<3:0>=0101. In this way, the row address is sent to the second group region RG1, and the row address is not sent to the first group region RG0 and the third group region RG2 to the eighth group region RG7.

It may be learned from the foregoing description that, when there is one target bit, there are two group regions in the memory; when there are two target bits, there are four group regions in the memory; and when there are three target bits, there are eight group regions in the memory. By analogy, when there are n target bits, there are $2^n$ group regions in the memory.

The control circuit 200 may be designed based on a requirement, to send the row address to one of the group regions based on the active command signal and at least one target bit of the bank group address. The control circuit 200 is designed through an example in which the memory includes only two group regions and the bank group address has one target bit.

Still referring to FIG. 2, the control circuit 200 includes a first address processing circuit 210 and two row address transmission circuits. The two row address transmission circuits are denoted as a first row address transmission circuit 220 and a second row address transmission circuit 230. The first address processing circuit 210 is configured to obtain a complementary target bit based on the target bit. The complementary target bit is received at an input terminal of the first row address transmission circuit 220, and the row address is sent to the first group region RG0 based on the complementary target bit and the active command signal. The target bit is received at an input terminal of the second row address transmission circuit 230, and the row address is sent to the second group region RG1 based on the target bit and the active command signal.

The complementary target bit may be designed based on an actual requirement to control logic for sending the row address by the first row address transmission circuit 220, and the target bit may be designed based on an actual requirement to control logic for sending the row address by the second row address transmission circuit 230. For example, when the target bit is at a low level and the complementary target bit is at a high level, the first row address transmission circuit 220 is enabled to send the row address to the first group region RG0 under control of the active command signal, and the second row address transmission circuit 230 is enabled to stop sending the row address to the second group region RG1. When the target bit is at a high level and the complementary target bit is at a low level, the first row address transmission circuit 220 is enabled to stop sending the row address to the first group region RG0, and the second row address transmission circuit 230 is enabled to send the row address to the second group region RG1 under control of the active command signal.

Figure 4A:
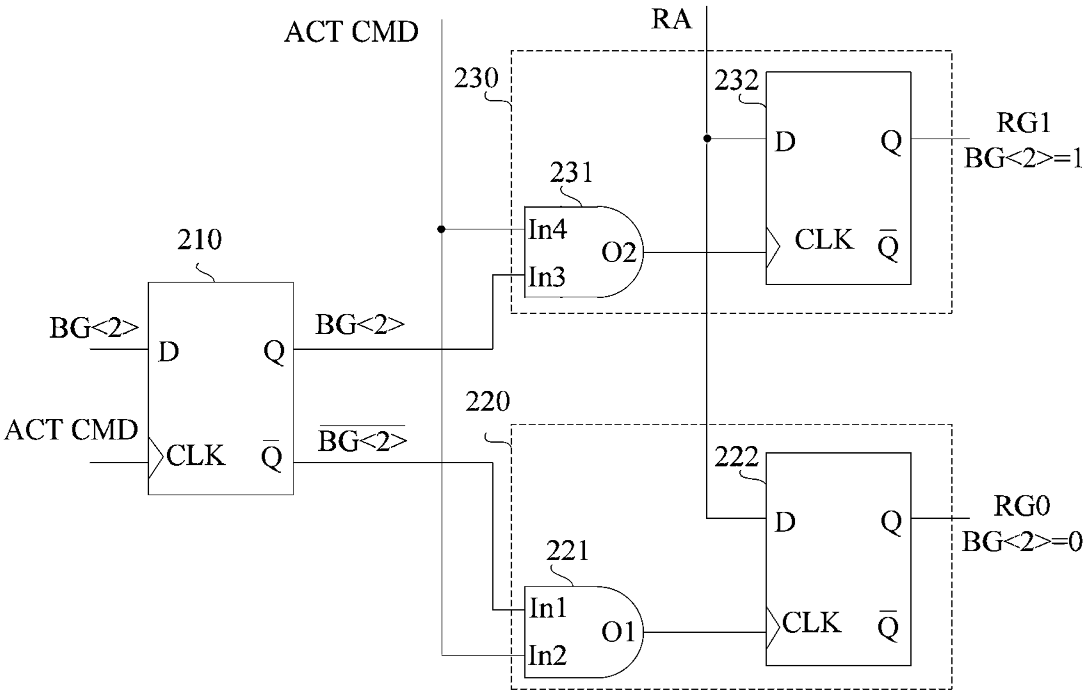
FIG. 4A and FIG. 4B are diagrams of circuit principles of a control circuit according to an embodiment of this application.
Figure 4B:
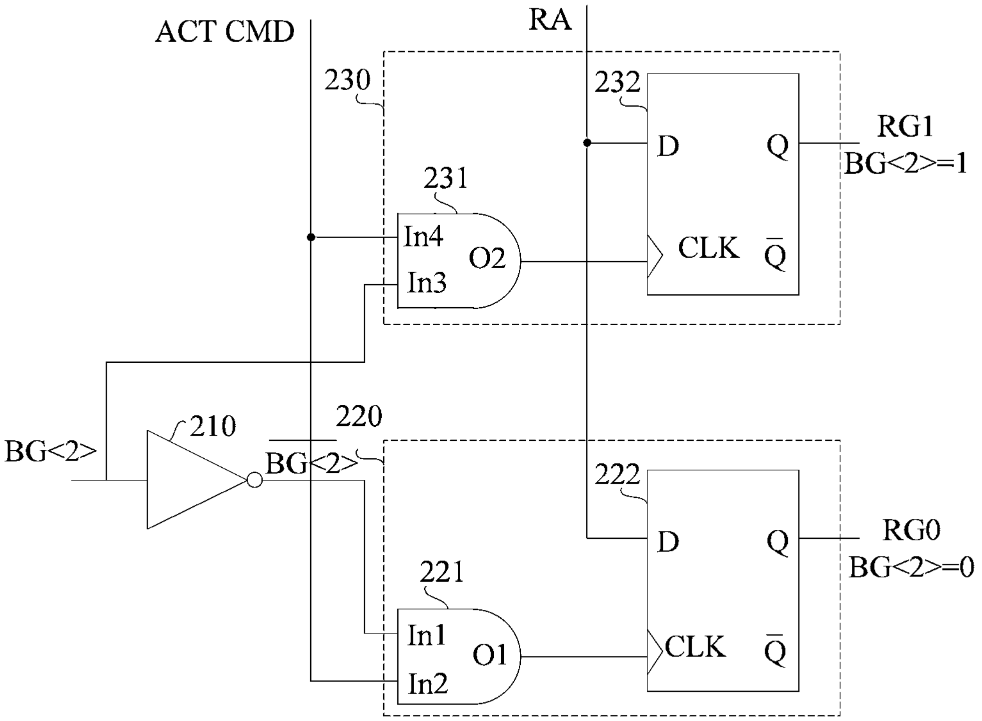

Further, FIG. 4A and FIG. 4B are diagrams of circuit principles of a control circuit 200 according to an embodiment of this application. As shown in FIG. 4A, the first address processing circuit 210 includes a first flip-flop. The target bit is received at an input terminal of the first flip-flop, the active command signal is received at a clock terminal of the first flip-flop, the target bit is output through an output terminal of the first flip-flop, and the complementary target bit is output through a complementary output terminal of the first flip-flop. As shown in FIG. 4B, the first address processing circuit 210 includes a first inverter. The target bit is received at an input terminal of the first inverter, and the complementary target bit of the target bit is output.

As shown in FIG. 4A, the first row address transmission circuit 220 includes a first AND gate 221 and a second flip-flop 222. A first input terminal of the first AND gate 221 is connected to the complementary output terminal of the first flip-flop to receive the complementary target bit, the active command signal is received at a second input terminal of the first AND gate 221, and an output terminal of the first AND gate 221 is connected to a clock terminal of the second flip-flop 222. The row address is received at an input terminal of the second flip-flop 222, and the row address is output to the first group region RG0 by the second flip-flop 222 under triggering of a signal received at the clock terminal. The second row address transmission circuit 230 includes a second AND gate 231 and a third flip-flop 232. A first input terminal of the second AND gate 231 is connected to the output terminal of the first flip-flop to receive the target bit, the active command signal is received at a second input terminal of the second AND gate 231, and an output terminal of the second AND gate 231 is connected to a clock terminal of the third flip-flop 232. The row address is received at an input terminal of the third flip-flop 232, and the third flip-flop 232 is configured to output the row address to the second group region RG1 under triggering of a signal received at the clock terminal.

As shown in FIG. 4B, the first row address transmission circuit 220 includes a first AND gate 221 and a second flip-flop 222. A first input terminal of the first AND gate 221 is connected to an output terminal of the first inverter to receive the complementary target bit, the active command signal is received at a second input terminal of the first AND gate 221, and an output terminal of the first AND gate 221 is connected to a clock terminal of the second flip-flop 222. The row address is received at an input terminal of the second flip-flop 222, and the row address is output to the first group region RG0 by the second flip-flop 222 under triggering of a signal received at the clock terminal. The second row address transmission circuit 230 includes a second AND gate 231 and a third flip-flop 232. The target bit is received at a first input terminal of the second AND gate 231, the active command signal is received at a second input terminal of the second AND gate 231, and an output terminal of the second AND gate 231 is connected to a clock terminal of the third flip-flop 232. The row address is received at an input terminal of the third flip-flop 232, and the third flip-flop 232 is configured to output the row address to the second group region RG1 under triggering of a signal received at the clock terminal.

Figure 5A:
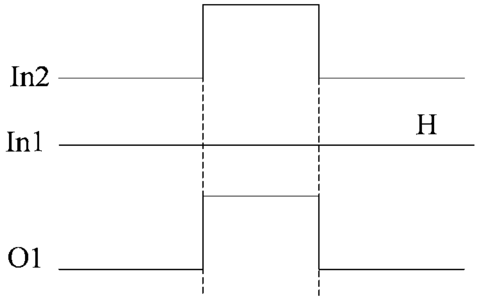
FIG. 5A and FIG. 5B are diagrams of working principles of a row address transmission circuit according to an embodiment of this application.
Figure 5B:
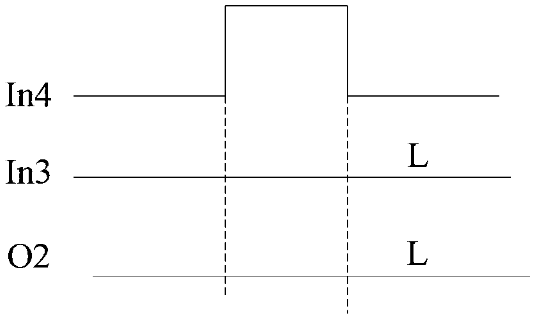

FIG. 5A and FIG. 5B are schematic diagrams of logic of the first address processing circuit 210 according to an embodiment of this application. As shown in FIG. 5A and FIG. 5B, when a level of the target bit in the bank group address received by the control circuit 200 is a low level, the complementary target bit is at a high level. After an AND logical operation is performed by the first AND gate 221 on the complementary target bit and the active command signal, an output signal is a clock pulse signal, and the row address is output to the first group region RG0 by the second flip-flop 222. After an AND logical operation is performed by the second AND gate 231 on the target bit and the active command signal, an output signal continues to be at a low level, and the row address is not output to the second group region RG1 by the third flip-flop 232.

When a level of the target bit in the bank group address received by the control circuit 200 is at a high level, the complementary target bit is at a low level. After an AND logical operation is performed by the first AND gate 221 on the complementary target bit and the active command signal, an output signal continues to be at a low level, and the row address is not output to the first group region RG0 by the second flip-flop 222. After an AND logical operation is performed by the second AND gate 231 on the target bit and the active command signal, an output signal is a clock pulse signal, and the row address is output to the second group region RG1 by the third flip-flop 232.

Through the control circuit described above, the row address is sent to a group region in which a bank group corresponding to the bank group address received by the control circuit 200 is located, so that row address sending paths are reduced, thereby reducing power consumption of the memory.

The control circuit 200 is designed through an example in which the bank group address has n target bits and the memory includes $2^n$ group regions, where n is an integer greater than 1. The n target bits are denoted as a first target bit, a second target bit, . . . , and an nth target bit. A second address processing circuit 410, $2^n$ control signal circuits, and $2^n$ row address transmission circuits are included in the control circuit 200. The $2^n$ control signal circuits are in a one-to-one correspondence with the $2^n$ row address transmission circuits, and the $2^n$ row address transmission circuits are in a one-to-one correspondence with the $2^n$ group regions.

The second address processing circuit is configured to obtain complementary target bits of the n target bits, each control signal circuit is configured to generate one control signal based on n input signals, and a corresponding control signal is received by each row address transmission circuit, which is configured to send the row address to a corresponding group region based on the control signal and the active command signal. The n input signals are denoted as a first input signal, a second input signal, . . . , and an nth input signal. If an ith target bit of a bank group address in a group region corresponding to the control signal circuit is at a first level, the ith input signal is an ith target bit. If the ith target bit of the bank group address in the group region corresponding to the control signal circuit is at a second level, the ith input signal is a complementary target bit of the ith target bit. 1≤i≤n, and i is an integer.

Control logic of the control signal circuit is described with any control signal circuit as an example. If a bank group to which the received bank group address points is in the group region corresponding to the control signal circuit, the n input signals in the control signal circuit are all at the first level. When it is determined by the control signal circuit that all the n input signals are at the first level, a control signal output by the control signal circuit is a valid value, and the row address transmission circuit may be controlled by the control signal to send the row address to the corresponding group region. If the bank group to which the received bank group address points is not in the group region corresponding to the control signal circuit, at least one of the n input signals in the control signal circuit is not at the first level. When it is determined by the control signal circuit that at least one of the n input signals is not at the first level, the control signal output by the control signal circuit is an invalid value, and the row address transmission circuit cannot be controlled by the control signal to send the row address to the corresponding group region. In this way, the row address can be sent to a group region based on the received bank group address, so that row address sending paths are reduced, thereby reducing power consumption of the memory.

The second address processing circuit 410 includes n fourth flip-flops, denoted as a first fourth flip-flop, a second fourth flip-flop, . . . , and an nth fourth flip-flop. An ith target bit is received at an input terminal of an ith fourth flip-flop, the active command signal is received at a clock terminal of the ith fourth flip-flop, the ith target bit is output through an output terminal of the ith fourth flip-flop, and a complementary target bit of the ith target bit is output through a complementary output terminal of the ith fourth flip-flop.

The second address processing circuit 410 includes n second inverters, denoted as a first second inverter, a second inverter, . . . , and an nth second inverter. The ith target bit is received at an input terminal of an ith second inverter, and the complementary target bit of the ith target bit is output through an output terminal of the ith second inverter.

When the first level is a low level and the second level is a high level, the control signal circuit includes a NOR gate.

The NOR gate includes n input terminals. One input signal is received at each input terminal, and the control signal is output after a NOR operation is performed on the n input signals. When all the n input signals are at a low level, the control signal output by the NOR gate is at a high level, the control signal is a valid value, and the row address transmission circuit may be controlled by the control signal to send the row address to the corresponding group region. When one of the n input signals is at a high level, the control signal output by the NOR gate is at a low level, the control signal is an invalid value, and the row address transmission circuit cannot be controlled by the control signal to send the row address to the corresponding group region.

When the first level is a high level and the second level is a low level, the control signal circuit includes a third AND gate. The third AND gate includes n input terminals. One input signal is received at each input terminal, and the control signal is output after an AND operation is performed on the n input signals. When all the n input signals are at a high level, the control signal output by the third AND gate is at a high level, the control signal is a valid value, and the row address transmission circuit may be controlled by the control signal to send the row address to the corresponding group region. When one of the n input signals is at a low level, the control signal output by the third AND gate is at a low level, the control signal is an invalid value, and the row address transmission circuit cannot be controlled by the control signal to send the row address to the corresponding group region.

The row address transmission circuit 430 includes a fourth AND gate 431 and a fifth flip-flop 432. The fourth AND gate 431 includes two input terminals. The control signal is received at a first input terminal of the fourth AND gate 431, the active command signal is received at a second input terminal of the fourth AND gate 431, and an output terminal of the fourth AND gate 431 is connected to a clock terminal of the fifth flip-flop 432. The row address is received at an input terminal of the fifth flip-flop 432, which is configured to output the row address under triggering of a signal received at the clock terminal.

Control logic of the row address transmission circuit is described with any row address transmission circuit as an example. When the received control signal is at a high level, after an AND logical operation is performed by the fourth AND gate 431 on the control signal and the active command signal, an output signal is a clock pulse signal, and the row address is output to a corresponding group region by the fifth flip-flop 432. When the received control signal is at a low level, after an AND logical operation is performed by the fourth AND gate 431 on the control signal and the active command signal, an output signal continues to be at a low level, and the row address stops to be output to the corresponding group region by the fifth flip-flop 432.

Figure 6A:
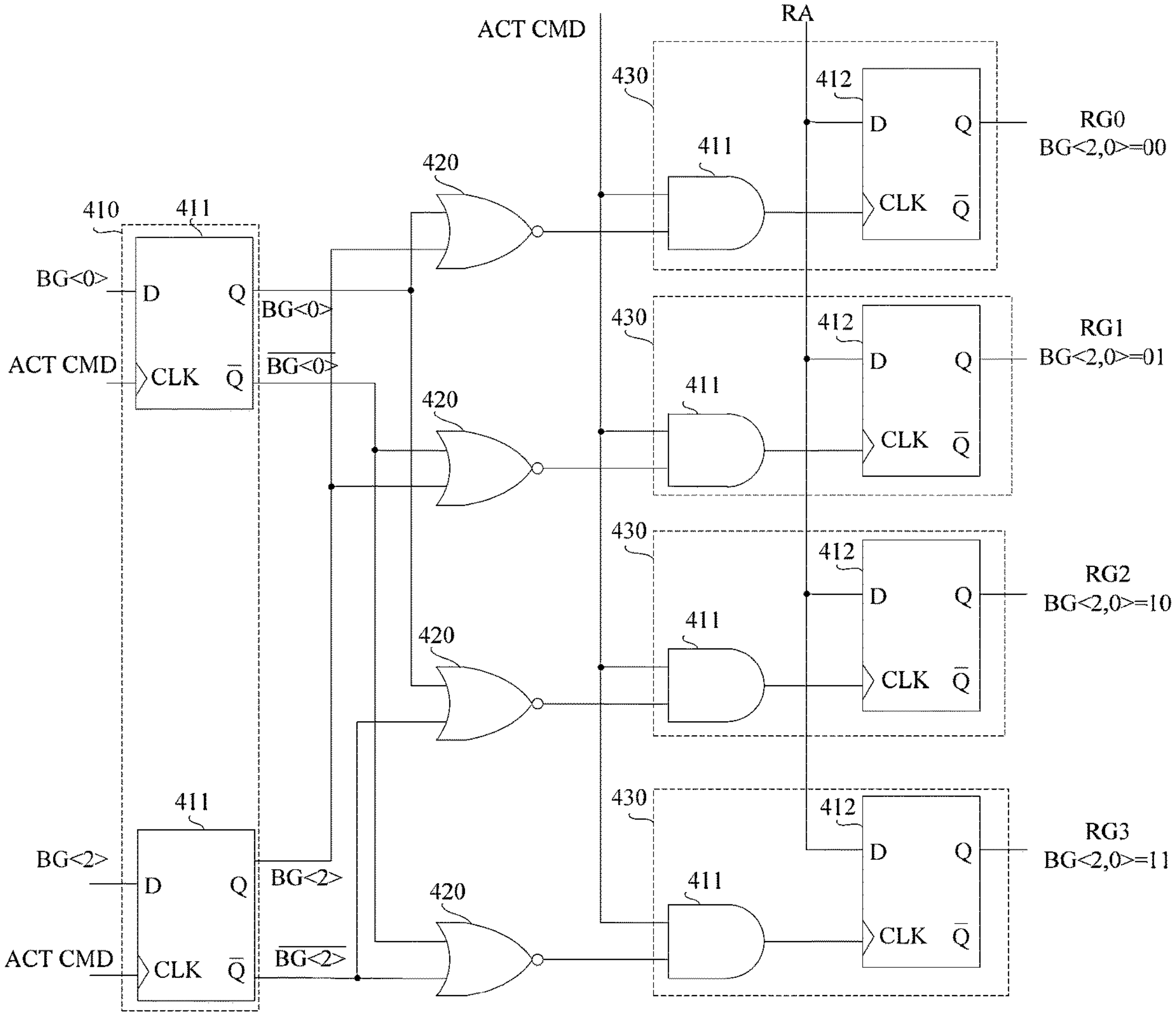
FIG. 6A, FIG. 6B, and FIG. 6C are diagrams of circuit principles of a control circuit according to an embodiment of this application.
Figure 6B:
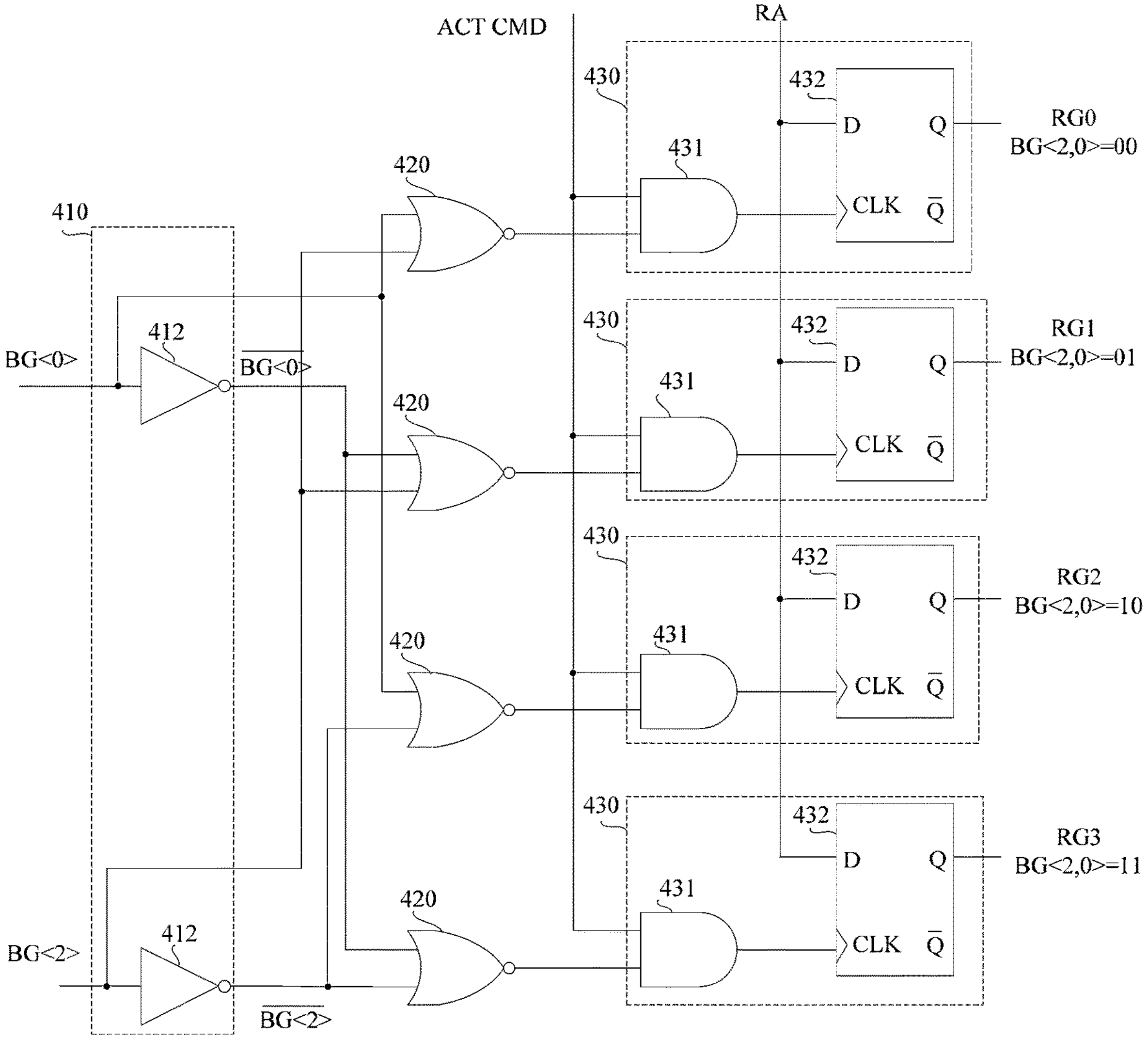
Figure 6C:
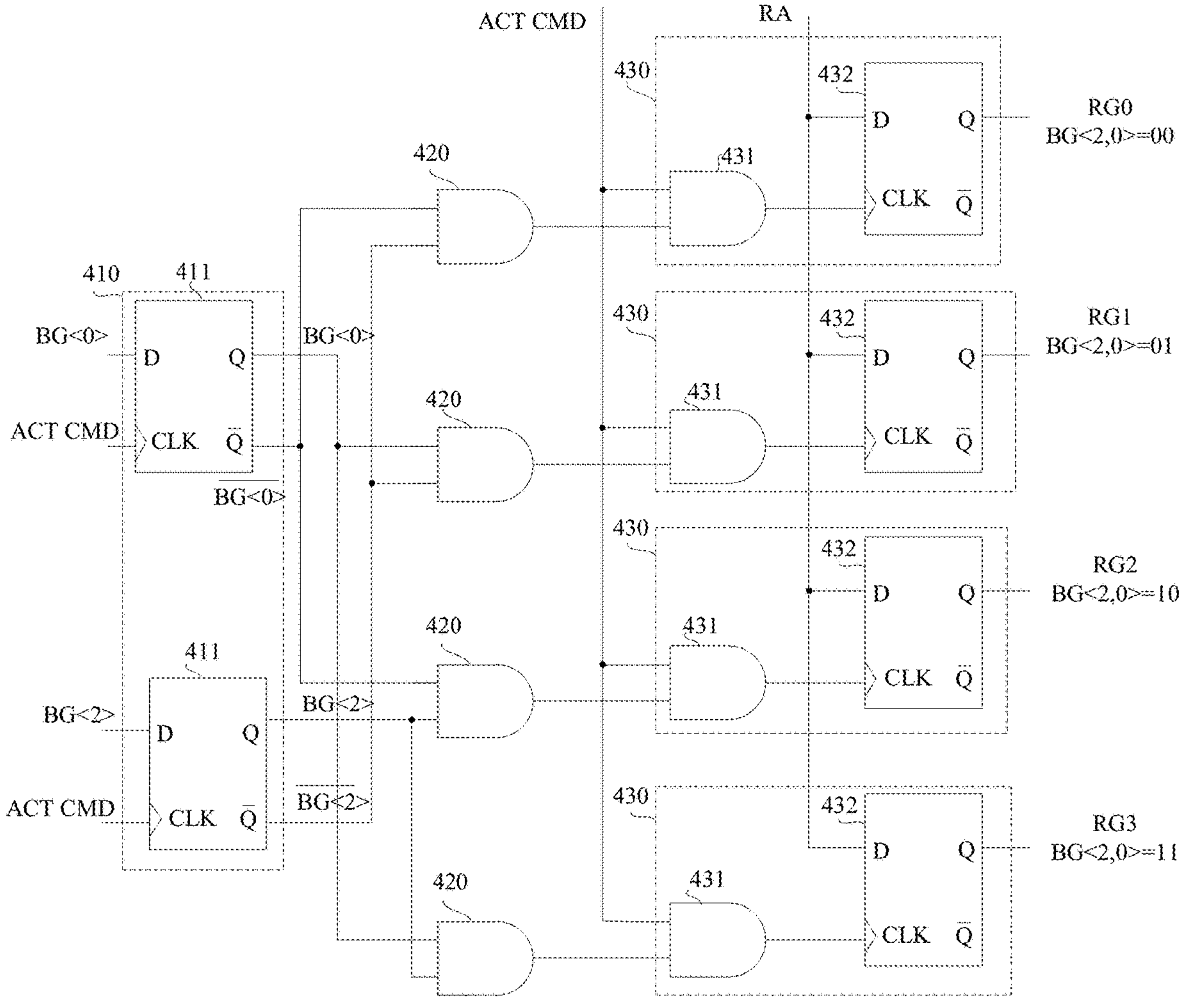

FIG. 6A, FIG. 6B, and FIG. 6C are schematic diagrams of principles of the control circuit 200 according to an embodiment of this application. As shown in FIG. 6A, FIG. 6B, and FIG. 6C, for example, the bank group address is BG<2:0>, there are two target bits, denoted as BG<2> and BG<0>, and the memory includes four group regions, four row address transmission circuits 430, and four control signal circuits 420. A first row address transmission circuit is controlled by a first control signal circuit to send the row address to the first group region RG0, a second row address transmission circuit is controlled by a second control signal circuit to send the row address to the second group region RG1, a third row address transmission circuit is controlled by a third control signal circuit to send the row address to the third group region RG2, and a fourth row address transmission circuit is controlled by a fourth control signal circuit to send the row address to the fourth group region RG3.

As shown in FIG. 6A and FIG. 6C, the second address processing circuit 410 includes two fourth flip-flops 411, denoted as a first fourth flip-flop and a second fourth flip-flop. BG<0> is received at an input terminal of the first fourth flip-flop, the active command signal is received at a clock terminal of the first fourth flip-flop, BG<0> is output through an output terminal of the first fourth flip-flop, and a complementary signal of BG<0> is output through a complementary output terminal of the first fourth flip-flop. BG<2> is received at an input terminal of the second fourth flip-flop, the active command signal is received at a clock terminal of the second fourth flip-flop, BG<2> is output through an output terminal of the second fourth flip-flop, and a complementary signal of BG<2> is output through a complementary output terminal of the second fourth flip-flop.

As shown in FIG. 6B, the second address processing circuit 410 includes two second inverters 412, denoted as a first second inverter and a second inverter. BG<0> is received at an input terminal of the first second inverter, and the complementary signal of BG<0> is output through an output terminal. BG<2> is received at an input terminal of the second inverter, and the complementary signal of BG<2> is output through an output terminal.

As shown in FIG. 6A and FIG. 6B, the four control signal circuits 420 each include a NOR gate, and each NOR gate includes two input terminals. Both BG<2> and BG<0> of the bank group address in the first group region RG0 are at a low level. BG<0> is received at a first input terminal of the NOR gate in the first control signal circuit, and BG<2> is received at a second input terminal. BG<2> and BG<0> of the bank group address in the second group region RG1 are respectively at a low level and a high level, the complementary signal of BG<0> is received at a first input terminal of the NOR gate in the second control signal circuit, and BG<2> is received at a second input terminal. BG<2> and BG<0> of the bank group address in the third group region RG2 are respectively at a high level and a low level, BG<0> is received at a first input terminal of the NOR gate in the third control signal circuit, and the complementary signal of BG<2> is received at a second input terminal. Both BG<2> and BG<0> of the bank group address in the fourth group region RG3 are at a high level. The complementary signal of BG<0> is received at a first input terminal of the NOR gate in the fourth control signal circuit, and the complementary signal of BG<2> is received at a second input terminal.

When the bank group address is BG<2:0>=000, both input terminals of the NOR gate in the first control signal circuit are at a low level, and an output control signal is at a high level. One input terminal of the NOR gate in the second control signal circuit is at a high level, the other input terminal is at a low level, and an output control signal is at a low level. One input terminal of the NOR gate in the third control signal circuit is at a high level, the other input terminal is at a low level, and an output control signal is at a low level. Two input terminals of the NOR gate in the fourth control signal circuit are at a high level, and an output control signal is at a low level.

As shown in FIG. 6C, the four control signal circuits each include a third AND gate, and each third AND gate includes two input terminals. The complementary signal of BG<0> is received at a first input terminal of the third AND gate in the first control signal circuit, and the complementary signal of BG<2> is received at a second input terminal. BG<0> is received at a first input terminal of the third AND gate in the second control signal circuit, and the complementary signal of BG<2> is received at a second input terminal. The complementary signal of BG<0> is received at a first input terminal of the third AND gate in the third control signal circuit, and BG<2> is received at a second input terminal. BG<0> is received at a first input terminal of the third AND gate in the fourth control signal circuit, and BG<2> is received at a second input terminal.

When the bank group address is BG<2:0>=000, both input terminals of the third AND gate in the first control signal circuit are at a high level, and an output control signal is at a high level. One input terminal of the third AND gate in the second control signal circuit is at a high level, the other input terminal is at a low level, and an output control signal is at a low level. One input terminal of the third AND gate in the third control signal circuit is at a high level, the other input terminal is at a low level, and an output control signal is at a low level. Two input terminals of the third AND gate in the fourth control signal circuit are at a low level, and an output control signal is at a low level.

A control signal output by the first control signal circuit is at a high level, and control signals output by the second control signal circuit to the fourth control signal circuit are all at a low level. The row address is sent to the first group region RG0 by the first row address transmission circuit under control of the corresponding control signal, and the row address stops to be sent by the second row address transmission circuit to the fourth row address transmission circuit to the corresponding group regions under control of the corresponding control signals.

Figure 7A:
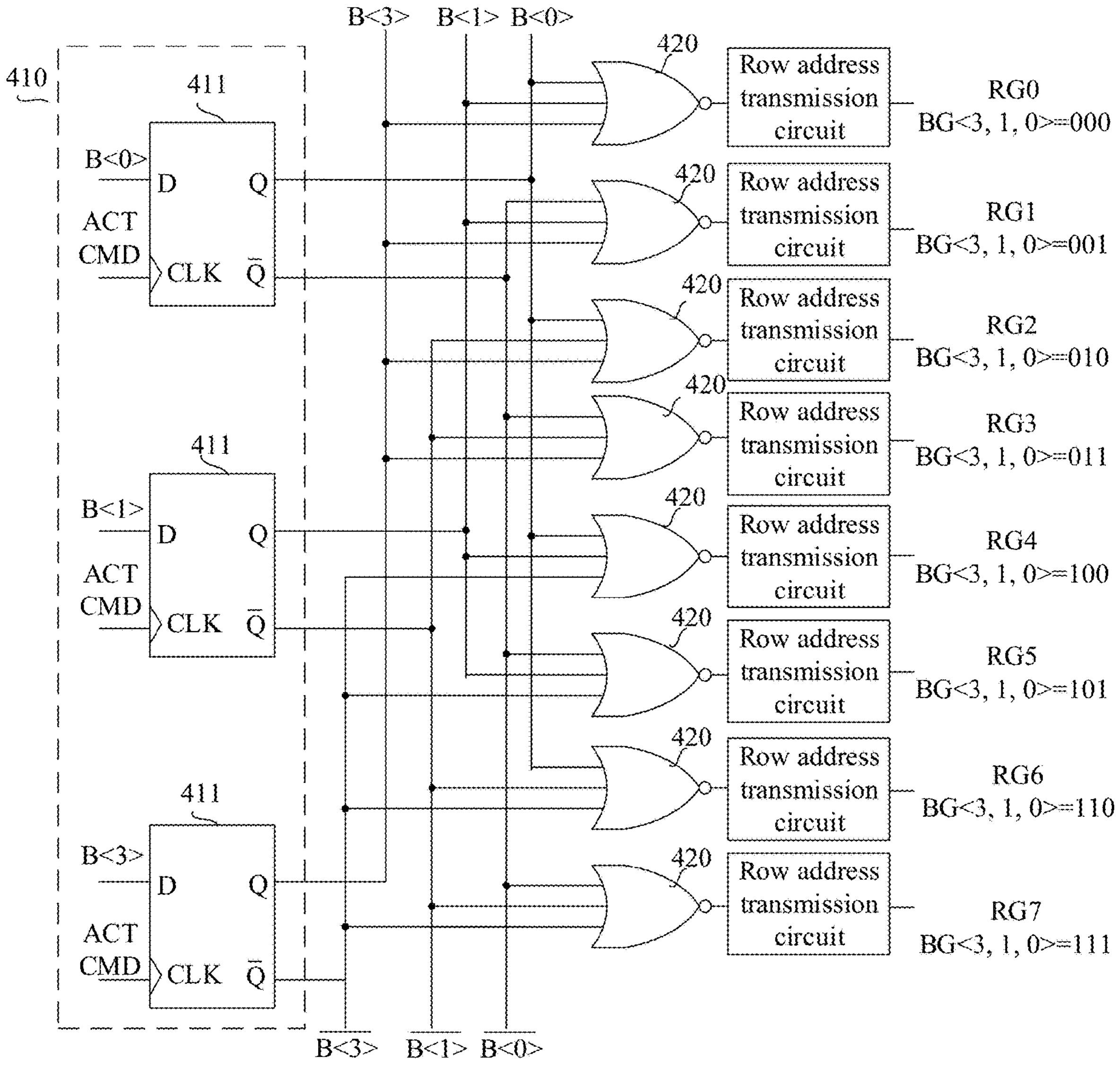
FIG. 7A and FIG. 7B are diagrams of circuit principles of a control circuit according to an embodiment of this application.
Figure 7B:
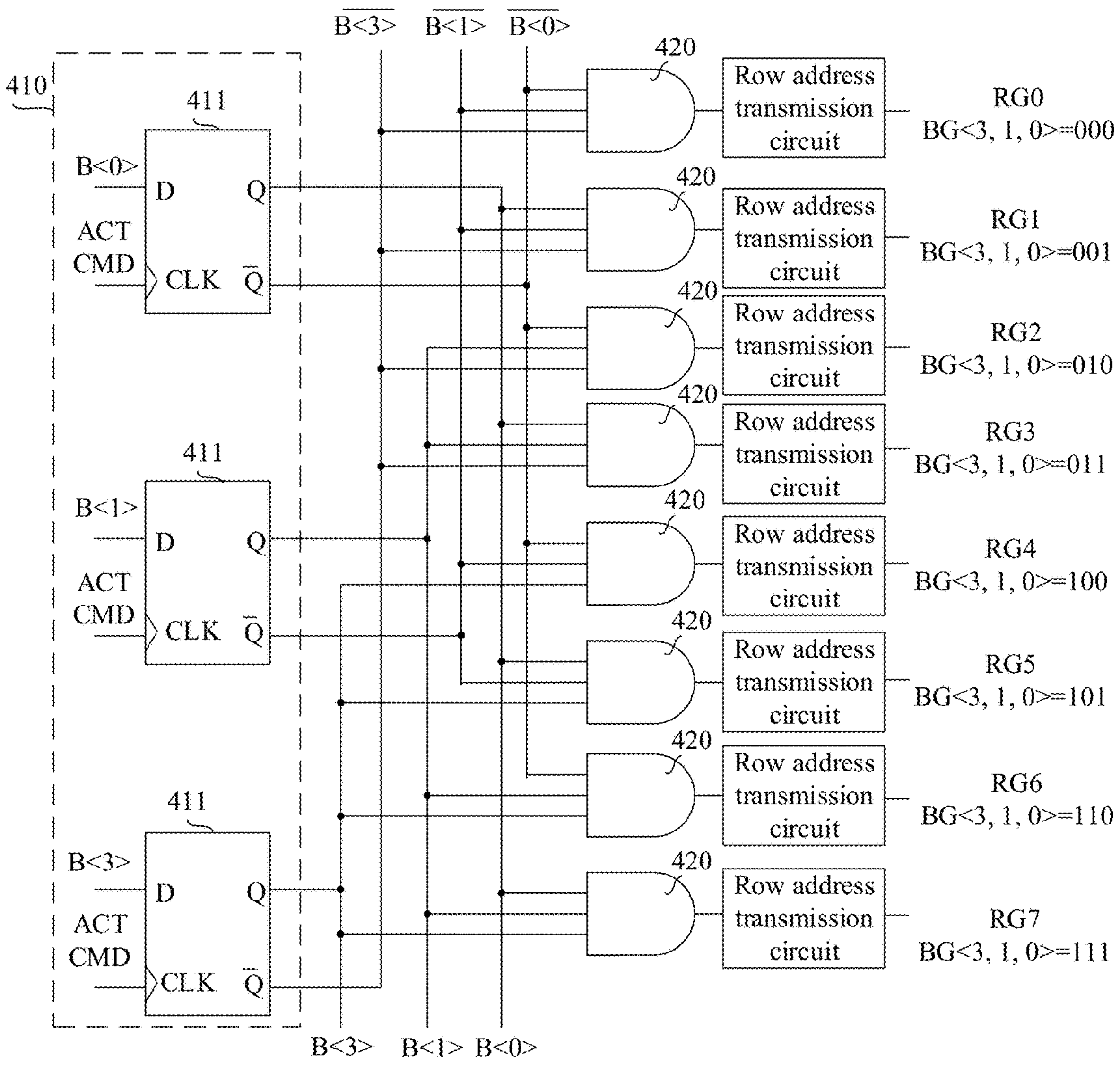

FIG. 7A and FIG. 7B are schematic diagrams of principles of the control circuit 200 according to an embodiment of this application. As shown in FIG. 7A and FIG. 7B, for example, the bank group address is BG<3:0>, there are three target bits, denoted as BG<2>, BG<1>, and BG<0>, and the memory includes eight group regions, eight row address transmission circuits, and eight control signal circuits. A first row address transmission circuit is controlled by a first control signal circuit to send the row address to the first group region RG0, a second row address transmission circuit is controlled by a second control signal circuit to send the row address to the second group region RG1, . . . , and an eighth row address transmission circuit is controlled by an eighth control signal circuit to send the row address to the eighth group region RG7.

As shown in FIG. 7A and FIG. 7B, the second address processing circuit 410 includes three fourth flip-flops 411, denoted as a first fourth flip-flop, a second fourth flip-flop, and a third fourth flip-flop 411. BG<0> is received at an input terminal of the first fourth flip-flop, the active command signal is received at a clock terminal of the first fourth flip-flop, BG<0> is output through an output terminal of the first fourth flip-flop, and a complementary signal of BG<0> is output through a complementary output terminal of the first fourth flip-flop. BG<1> is received at an input terminal of the second fourth flip-flop, the active command signal is received at a clock terminal of the second fourth flip-flop, BG<1> is output through an output terminal of the second fourth flip-flop, and a complementary signal of BG<1> is output through a complementary output terminal of the second fourth flip-flop. BG<3> is received at an input terminal of the third fourth flip-flop 411, the active command signal is received at a clock terminal of the third fourth flip-flop 411, BG<3> is output through an output terminal of the third fourth flip-flop 411, and a complementary signal of BG<3> is output through a complementary output terminal of the third fourth flip-flop 411.

As shown in FIG. 7A, the eight control signal circuits 420 each include a NOR gate, and each NOR gate includes three input terminals. BG<3>, BG<1>, and BG<0> of the bank group address in the first group region RG0 are all at a low level. BG<0> is received at a first input terminal of the NOR gate in the first control signal circuit, BG<1> is received at a second input terminal, and BG<3> is received at a third input terminal. BG<3>, BG<1>, and BG<0> of the bank group address in the second group region RG1 are respectively at a low level, a low level, and a high level. The complementary signal of BG<0> is received at a first input terminal of the NOR gate in the second control signal circuit, BG<1> is received at a second input terminal, and BG<3> is received at a third input terminal. BG<3>, BG<1>, and BG<0> of the bank group address in the third group region RG2 are respectively at a low level, a high level, and a low level. BG<0> is received at a first input terminal of the NOR gate in the third control signal circuit, the complementary signal of BG<1> is received at a second input terminal, and BG<3> is received at a third input terminal. BG<3>, BG<1>, and BG<0> of the bank group address in the fourth group region RG3 are all at a low level, a high level, and a high level. The complementary signal of BG<0> is received at a first input terminal of the NOR gate in the fourth control signal circuit, the complementary signal of BG<1> is received at a second input terminal, and BG<3> is received at a third input terminal.

BG<3>, BG<1>, and BG<0> of the bank group address in the fifth group region RG4 are respectively at a high level, a low level, and a low level. BG<0> is received at a first input terminal of the NOR gate in the fifth control signal circuit, BG<1> is received at a second input terminal, and the complementary signal of BG<3> is received at a third input terminal. BG<3>, BG<1>, and BG<0> of the bank group address in the sixth group region RG5 are respectively at a high level, a low level, and a high level. The complementary signal of BG<0> is received at a first input terminal of the NOR gate in the sixth control signal circuit, BG<1> is received at a second input terminal, and the complementary signal of BG<3> is received at a third input terminal. BG<3>, BG<1>, and BG<0> of the bank group address in the seventh group region RG6 are respectively at a high level, a high level, and a low level. BG<0> is received at a first input terminal of the NOR gate in the seventh control signal circuit, the complementary signal of BG<1> is received at a second input terminal, and the complementary signal of BG<3> is received at a third input terminal. BG<3>, BG<1>, and BG<0> of the bank group address in the eighth group region RG7 are all at a high level, a high level, and a high level. The complementary signal of BG<0> is received at a first input terminal of the NOR gate in the eighth control signal circuit, the complementary signal of BG<1> is received at a second input terminal, and the complementary signal of BG<3> is received at a third input terminal.

When the bank group address is BG<3:0>=0000, three input terminals of the NOR gate in the first control signal circuit are all at a low level, and an output control signal is at a high level. One input terminal of each of the NOR gates in the second control signal circuit, the third control signal circuit, and the fifth control signal circuit is at a high level, two input terminals are at a low level, and an output control signal is at a low level. Two input terminals of the NOR gates in the fourth control signal circuit, the sixth control signal circuit, and the seventh control signal circuit are at a high level, the other input terminal is at a low level, and an output control signal is at a low level. Three input terminals of the NOR gate in the eighth control signal circuit are at a high level, and an output control signal is at a low level.

As shown in FIG. 7B, the eight control signal circuits 420 each include a third AND gate, and each third AND gate includes three input terminals. BG<3>, BG<1>, and BG<0> of the bank group address in the first group region RG0 are all at a low level. The complementary signal of BG<0> is received at a first input terminal of the third AND gate in the first control signal circuit, the complementary signal of BG<1> is received at a second input terminal, and the complementary signal of BG<3> is received at a third input terminal. BG<3>, BG<1>, and BG<0> of the bank group address in the second group region RG1 are respectively at a low level, a low level, and a high level. BG<0> is received at a first input terminal of the third AND gate in the second control signal circuit, the complementary signal of BG<1> is received at a second input terminal, and the complementary signal of BG<3> is received at a third input terminal. BG<3>, BG<1>, and BG<0> of the bank group address in the third group region RG2 are respectively at a low level, a high level, and a low level. The complementary signal of BG<0> is received at a first input terminal of the third AND gate in the third control signal circuit, BG<1> is received at a second input terminal, and the complementary signal of BG<3> is received at a third input terminal. BG<3>, BG<1>, and BG<0> of the bank group address in the fourth group region RG3 are all at a low level, a high level, and a high level. BG<0> is received at a first input terminal of the third AND gate in the fourth control signal circuit, BG<1> is received at a second input terminal, and the complementary signal of BG<3> is received at a third input terminal.

BG<3>, BG<1>, and BG<0> of the bank group address in the fifth group region RG4 are respectively at a high level, a low level, and a low level. The complementary signal of BG<0> is received at a first input terminal of the third AND gate in the fifth control signal circuit, the complementary signal of BG<1> is received at a second input terminal, and BG<3> is received at a third input terminal. BG<3>, BG<1>, and BG<0> of the bank group address in the sixth group region RG5 are respectively at a high level, a low level, and a high level. BG<0> is received at a first input terminal of the third AND gate in the sixth control signal circuit, the complementary signal of BG<1> is received at a second input terminal, and BG<3> is received at a third input terminal. BG<3>, BG<1>, and BG<0> of the bank group address in the seventh group region RG6 are respectively at a high level, a high level, and a low level. The complementary signal of BG<0> is received at a first input terminal of the third AND gate in the seventh control signal circuit, BG<1> is received at a second input terminal, and BG<3> is received at a third input terminal. BG<3>, BG<1>, and BG<0> of the bank group address in the eighth group region RG7 are all at a high level, a high level, and a high level. BG<0> is received at a first input terminal of the third AND gate in the eighth control signal circuit, BG<1> is received at a second input terminal, and BG<3> is received at a third input terminal.

When the bank group address is BG<3:0>=0000, three input terminals of the third AND gate in the first control signal circuit are all at a high level, and an output control signal is at a high level. Two input terminals of each of the third AND gates in the second control signal circuit, the third control signal circuit, and the fifth control signal circuit are at a high level, one input terminal is at a low level, and an output control signal is at a low level. One input terminal of each of the third AND gates in the fourth control signal circuit, the sixth control signal circuit, and the seventh control signal circuit is at a high level, two input terminals are at a low level, and an output control signal is at a low level. Three input terminals of the third AND gate in the eighth control signal circuit are at a low level, and an output control signal is at a low level.

A control signal output by the first control signal circuit is at a high level, and control signals output by the second control signal circuit to the eighth control signal circuit are all at a low level. The row address is sent to the first group region RG0 by the first row address transmission circuit under control of the corresponding control signal, and the row address stops to be sent by the second row address transmission circuit to the eighth row address transmission circuit to the corresponding group regions under control of the corresponding control signals.

A person skilled in the art can easily figure out other implementation solutions of this application after considering the specification and practice of the present disclosure herein. This application aims to cover any variations, uses, or adaptations of this application. These variations, uses, or adaptations follow the general principles of this application and include common knowledge or conventional technical means in the art that are not disclosed in this application. The specification and embodiments are merely considered as examples, and the true scope and spirit of this application are pointed out in the following claims.

It should be understood that this application is not limited to the precise structures described above and shown in the accompanying drawings, and various modifications and changes may be made without departing from the scope thereof. The scope of this application is limited only by the appended claims.

What is claimed is:

1. A memory, comprising a plurality of group regions, a command decoding circuit, and a control circuit;

each group region comprising a plurality of bank groups, and each bank group corresponding to one bank group address;

the command decoding circuit receiving an active instruction, and decoding the active instruction to obtain an active command signal; and the control circuit receiving the bank group address, a row address, and the active command signal, and sending the row address to one of the group regions based on the active command signal and the bank group address;

wherein the control circuit is configured to:

send the row address to the one of the group regions based on the active command signal and at least one target bit of the bank group address;

the target bit of the bank group address being a same address bit as a corresponding address bit in any other bank group address in the group region.

2. The memory according to claim 1, wherein the bank group address has one target bit, and the memory comprises a first group region and a second group region; and the control circuit comprises a first address processing circuit and two row address transmission circuits, denoted as a first row address transmission circuit and a second row address transmission circuit;

the first address processing circuit being configured to obtain a complementary target bit based on the target bit;

an input terminal of the first row address transmission circuit receiving the complementary target bit, and sending the row address to the first group region based on the complementary target bit and the active command signal; and an input terminal of the second row address transmission circuit receiving the target bit, and sending the row address to the second group region based on the target bit and the active command signal.

3. The memory according to claim 2, wherein the first address processing circuit comprises:

a first flip-flop, an input terminal receiving the target bit, a clock terminal receiving the active command signal, an output terminal outputting the target bit, and a complementary output terminal outputting the complementary target bit.

4. The memory according to claim 2, wherein the first address processing circuit comprises:

a first inverter, an input terminal receiving the target bit, and an output terminal outputting the complementary target bit of the target bit.

5. The memory according to claim 2, wherein the first row address transmission circuit comprises:

a first AND gate, comprising two input terminals, a first input terminal receiving the complementary target bit, a second input terminal receiving the active command signal, and an output terminal being connected to a clock terminal of a second flip-flop; and the second flip-flop, configured to output the row address to the first group region under triggering of a signal received at the clock terminal, an input terminal receiving the row address; and the second row address transmission circuit comprises:

a second AND gate, comprising two input terminals, a first input terminal receiving the target bit, a second input terminal receiving the active command signal, and an output terminal being connected to a clock terminal of a third flip-flop; and the third flip-flop, configured to output the row address to the second group region under triggering of a signal received at the clock terminal, an input terminal receiving the row address.

6. The memory according to claim 1, wherein the bank group address has n target bits, the n target bits being denoted as a first target bit, a second target bit, . . . , and an nth target bit; and the memory comprises $2^n$ group regions, n being an integer greater than 1; and the control circuit comprises a second address processing circuit, $2^n$ control signal circuits, and $2^n$ row address transmission circuits, the $2^n$ control signal circuits being in a one-to-one correspondence with the $2^n$ row address transmission circuits, and the $2^n$ row address transmission circuits being in a one-to-one correspondence with the $2^n$ group regions;

the second address processing circuit being configured to obtain complementary target bits of the n target bits;

each control signal circuit being configured to generate one control signal based on n input signals; the n input signals being denoted as a first input signal, a second input signal, . . . , and an nth input signal; if an ith target bit of a bank group address in a group region corresponding to the control signal circuit is at a first level, an ith input signal being the ith target bit; if the ith target bit of the bank group address in the group region corresponding to the control signal circuit is at a second level, the ith input signal being a complementary target bit of the ith target bit; $1 \le i \le n$; and i being an integer; and each row address transmission circuit receiving the corresponding control signal, and being configured to send the row address to a corresponding group region based on the control signal and the active command signal.

7. The memory according to claim 6, wherein the second address processing circuit comprises n fourth flip-flops, denoted as a first fourth flip-flop, a second fourth flip-flop, . . . , and an nth fourth flip-flop;

an input terminal of an ith fourth flip-flop receiving the ith target bit, a clock terminal of the ith fourth flip-flop receiving the active command signal, an output terminal of the ith fourth flip-flop outputting the ith target bit, and a complementary output terminal of the ith fourth flip-flop outputting the complementary target bit of the ith target bit.

8. The memory according to claim 6, wherein the second address processing circuit comprises n second inverters, denoted as a first second inverter, a second second inverter, . . . , and an nth second inverter;

an input terminal of an ith second inverter receiving the ith target bit, and an output terminal of the ith second inverter outputting the complementary target bit of the ith target bit.

9. The memory according to claim 6, wherein when the first level is a low level and the second level is a high level, the control signal circuit comprises:

a NOR gate, comprising n input terminals with each input terminal receiving one input signal, and outputting the control signal after performing a NOR operation on the n input signals.

10. The memory according to claim 6, wherein when the first level is a high level and the second level is a low level, the control signal circuit comprises:

a third AND gate, comprising n input terminals with each input terminal receiving one input signal, and outputting the control signal after performing an AND operation on the n input signals.

11. The memory according to claim 6, wherein each row address transmission circuit comprises:

a fourth AND gate, comprising two input terminals, a first input terminal receiving the control signal, a second input terminal receiving the active command signal, and an output terminal being connected to a clock terminal of a fifth flip-flop; and the fifth flip-flop, configured to output the row address under triggering of a signal received at the clock terminal, an input terminal receiving the row address.

12. A memory, comprising a plurality of group regions, a command decoding circuit, and a control circuit;

each group region comprising a plurality of bank groups, and each bank group corresponding to one bank group address;

the command decoding circuit receiving an active instruction, and decoding the active instruction to obtain an active command signal; and the control circuit receiving the bank group address, a row address, and the active command signal, and sending the row address to one of the group regions based on the active command signal and the bank group address;

wherein the memory further comprising:

a window signal circuit, connected to the command decoding circuit and configured to receive the active command signal, the bank group address, and a bank address, and activate, based on the active command signal, the bank group address, and the bank address, a bank corresponding to the bank group address and the bank address.

* * * * *